United States Patent [19]

Ngan et al.

[11] Patent Number: 5,925,225
[45] Date of Patent: *Jul. 20, 1999

[54] METHOD OF PRODUCING SMOOTH TITANIUM NITRIDE FILMS HAVING LOW RESISTIVITY

[75] Inventors: Kenny King-tai Ngan, Fremont; Seshadri Ramaswami, San Jose, both of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/825,216

[22] Filed: Mar. 27, 1997

[51] Int. Cl.$^6$ .................................................. C23C 14/34
[52] U.S. Cl. .............................. 204/192.17; 204/298.06
[58] Field of Search ................................ 427/595, 126.1; 204/192.15, 192.17, 298.02, 298.06

[56] References Cited

U.S. PATENT DOCUMENTS

| | | | |
|---|---|---|---|
| 4,514,437 | 4/1985 | Nath | 427/39 |
| 4,944,961 | 7/1990 | Lu et al. | 427/38 |
| 4,976,839 | 12/1990 | Inoue | 204/192.17 |
| 5,108,951 | 4/1992 | Chen et al. | 437/187 |
| 5,236,868 | 8/1993 | Nulman | 437/190 |
| 5,288,665 | 2/1994 | Nulman | 437/194 |
| 5,346,600 | 9/1994 | Nieh et al. | 204/192.3 |
| 5,371,042 | 12/1994 | Ong | 437/194 |
| 5,455,197 | 10/1995 | Ghanbari et al. | 437/192 |
| 5,472,912 | 12/1995 | Miller | 437/194 |
| 5,497,025 | 3/1996 | Wong | 257/435 |
| 5,543,357 | 8/1996 | Yamada et al. | 437/192 |

FOREIGN PATENT DOCUMENTS 0758148  2/1997  European Pat. Off. ...... H01L 23/485

OTHER PUBLICATIONS

A. Bendavid et al., "Deposition and Modification of Titanium Nitride by Ion Assisted Arc Deposition", *J. Vac. Sci. Technol.*, Part A, vol. 13, No. 3, Part 2, pp. 1658–1664 (1995).
T. Hara et al., "Properties of Titanium Nitride Films for Barrier Metal in Aluminum Ohmic Contact Systems", *Jap. J. Appl. Physics*, vol. 30, No. 7, Part 1, pp. 1447–1451 (1991).
W. Jiang et al., "Pulsed–laser Deposition of Titanium Nitride", *Mat. Res. Soc. Symp. Proc.*, vol. 388, pp. 103–108 (1995).
M. Kawamura et al., "Characterization of TiN Films Prepared by a Conventional Magnetron Sputtering System: Influence of Nitrogen Flow Percentage and Electrical Properties", *Thin Solid Films*, vol. 287, No. 1, pp. 115–119 (1996).
D. R. McKenzie et al., "Production of Dense and Oriented Structures Including Titanium Nitride by Energetic Condensation from Plasmas", *Surface Science*, vol. 357/358, pp. 954–960 (1996).
S. M. Rossnagel, "Directional Sputter Deposition for Semiconductor Applications", *Mat. Res. Soc. Symp. Proc.*, vol. 354, pp. 503–510 (1995).
S. M. Rossnagel et al., "Thin, high atomic weight refractory film deposition for diffusion barrier, adhesion layer, and seed layer applications", *J. Vac. Sci. Technol.* B vol. 14, No. 3, pp. 1819–1827 (May/Jun. 1996).
Stimmell, "Properties of dc magnetron reactively sputtered TiN", J. Vac. Sci. Technol. B4(6), Nov./Dec. 1986, pp. 1377–1382.
S.M. Rossnagel and J. Hopwood, "Metal ion deposition from ionized mangetron sputtering discharge" J. Vac. Sci. Technol. B, vol. 12, No. 1, Jan./Feb. 1994, pp. 449–453.

*Primary Examiner*—Roy V. King
*Attorney, Agent, or Firm*—Shirley L. Church

[57] ABSTRACT

The resistivity of titanium nitride films is reduced, by about 40% (to less than about 60 $\mu$ Ohm-cm), for example; and, the film surface roughness is reduced, by about 45% (to less than 6 Å) by using a combination of particular process conditions during deposition of the film by an ion-deposition sputtering process.

10 Claims, 4 Drawing Sheets

METHOD OF PRODUCING SMOOTH TITANIUM NITRIDE FILMS HAVING LOW RESISTIVITY

BACKGROUND OF THE INVENTION

1. Field of the Invention

The present invention pertains to a titanium nitride film having a particular structure which provides a low resistivity and a smooth surface, and to the method used to create this film.

2. Brief Description of the Background Art

Titanium nitride layers have been used in semiconductor device structures as barrier layers for preventing the interdiffusion of adjacent layers of materials such as aluminum and silicon, for example. However, the resistivity of the titanium nitride, typically greater than 100 $\mu\Omega$-cm, detracts from the overall conductivity of the layered conductive structure to which it contributes. Further, if the titanium nitride surface is rough, this rough surface is mirrored in overlying layers, in an overlying aluminum layer, for example. A rough surface on the aluminum layer makes difficult subsequent photolithographic indexing process steps necessary for formation of the overall semiconductor device structure.

U.S. Pat. No. 4,514,437 to Prem Nath, issued Apr. 30, 1985, discloses a method and apparatus for depositing thin films, such as indium tin oxide, onto substrates. The deposition comprises one step in the fabrication of electronic, semiconductor and photovoltaic devices. An electron beam is used to vaporize a source of solid material, and electromagnetic energy is used to provide an ionizable plasma from reactant gases. By passing the vaporized solid material through the plasma, it is activated prior to deposition onto a substrate. In this manner, the solid material and the reactant gases are excited to facilitate their interaction prior to the deposition of the newly formed compound onto the substrate.

U.S. Pat. No. 4,944,961 to Lu et al., issued Jul. 31, 1990, describes a process for partially ionized beam deposition of metals or metal alloys on substrates, such as semiconductor wafers. Metal vaporized from a crucible is partially ionized at the crucible exit, and the ionized vapor is drawn to the substrate by an imposed bias. Control of substrate temperature is said to allow non-conformal coverage of stepped surfaces such as trenches or vias. When higher temperatures are used, stepped surfaces are planarized. The examples given are for aluminum deposition, where the non-conformal deposition is carried out with substrate temperatures ranging between about 150° C. and about 200° C., and the planarized deposition is carried out with substrate temperatures ranging between about 250° C. and about 350° C.

U.S. Pat. No. 4,976,839 to Minoru Inoue, issued Dec. 11, 1990 discloses a titanium nitride barrier layer of 500 Å to 2,000 Å in thickness formed by reactive sputtering in a mixed gas including oxygen in a proportion of 1% to 5% by volume relative to the other gases, comprising an inert gas and nitrogen. The temperature of the silicon substrate during deposition of the titanium nitride barrier layer ranged between about 350° C. and about 500° C. during the sputtering, and the resistivity of the titanium nitride film was "less than 100 $\mu\Omega$-cm", with no specific numbers other than the 100 $\mu\Omega$-cm given.

S. M. Rossnagel and J. Hopwood describe a technique of combining conventional magnetron sputtering with a high density, inductively coupled rf plasma in the region between the sputtering cathode and the substrate in their 1993 article titled "Metal ion deposition from ionized magnetron sputtering discharge", published in the J. Vac. Sci. Technol. B. Vol. 12, No. 1, Jan/Feb 1994. One of the examples given is for titanium nitride film deposition using reactive sputtering, where a titanium cathode is used in combination with a plasma formed from a combination of argon and nitrogen gases. The resistivity of the films produced ranged from about 200 $\mu\Omega$-cm to about 75 $\mu\Omega$-cm, where higher ion energies were required to produce the lower resistivity films. The higher the ion energy, the more highly stressed the films, however. Peeling of the film was common at thicknesses over 700 Å, with depositions on circuit topography features delaminating upon cleaving.

U.S. patent application, Ser. No. 08/511,825 of Xu et al. filed Aug. 7, 1995, assigned to the Assignee of the present invention, and hereby incorporated by reference in its entirety, describes a method of forming a titanium nitride-comprising barrier layer which acts as a carrier layer. The carrier layer enables the filling of apertures such as vias, holes or trenches of high aspect ratio and the planarization of a conductive film deposited over the carrier layer at reduced temperatures compared to prior art methods.

A titanium nitride barrier layer is most commonly used as part of a conductive stack of materials. In order to obtain optimized functionality of this barrier layer, the layer must prevent the diffusion or migration of adjacent materials through it (it must act as a barrier); it must provide high conductivity (exhibit minimal resistivity); and, it must provide a smooth surface so that other materials in the stack will not mirror surface roughness in the titanium nitride layer, thereby making subsequent lithography difficult.

It is important for the titanium nitride (TiN) film to have low resistivity, because in a typical interconnect structure, a cross-sectional schematic of which is shown in FIGS. 1A and 1B, the TiN film may need to serve as a main conductive path for the interconnect. For example, with reference to FIG. 1A, an interconnect structure 10 typically includes: a dielectric substrate 11; a diffusion barrier layer 14; and an overlying conductive layer 12. Aluminum is the most commonly used material for conductive layer 12. Arrow 16 represents the direction of travel of electrons, the electron path, through the aluminum conductive layer 12 of interconnect 10. However, the conductivity of an aluminum conductive layer 12 can become impaired due to stress or electromigration, which creates void structures of the kind shown in FIG. 1B. The interconnect structure 20 shows the dielectric substrate 21 having a diffusion barrier layer 24, followed by aluminum layer 22. The electron path 26 through aluminum layer 22 has become impaired due to the formation of voids 23 within aluminum layer 22. When the barrier layer 24 comprises TiN which is low in resistivity, the electron path 26 can then be assisted by a second path 28 through the TiN barrier layer 24. This facilitates the performance of interconnect 20, lengthening the performance lifetime of the interconnect. In some cases, the TiN barrier layer electron path 28 may become the main path of conductivity for interconnect 20. TiN barrier layers conventionally applied using physical vapor deposition (sputtering) techniques generally have a resistivity greater than about 100 $\mu$Ohm-cm.

It is important for the TiN film to be smooth (to have low surface roughness), as disclosed in U.S. patent application Ser. No. 08/511,825 of Xu et al. When the titanium nitride barrier layer is used to line a feature, such as a contact, trench, or via, a smooth surface on the titanium nitride layer facilitates the formation of the carrier layer of the kind described in Xu et al. This carrier layer facilitates aluminum filling of the feature at lower temperatures. Xu et al. were able to achieve a carrier layer surface roughness of about 15 Å rms.

A reduction in resistivity to less than about 100 μOhm-cm. and an improvement in surface roughness over that previously obtained would increase the desirability of the application of titanium nitride barrier layers.

SUMMARY OF THE INVENTION

It has been discovered that the amount the resistivity of titanium nitride films is reduced, by 40% or more (to less than about 75 μOhm-cm, preferably to less than 60 μOhm-cm, and most preferably to less than about 50 μOhm-cm), for example; and, the roughness of the surface is reduced, by about 45% or more (to less than 11 Å, and preferably to less than about 8 Å) by using a combination of particular process conditions during deposition.

In particular, titanium atoms produced by impact of inert gas ions upon a titanium target travel through a high density, inductively coupled rf plasma, an ion metal plasma (IMP), in which the titanium atoms are at least partially ionized. The ionized titanium ions are contacted with ionized nitrogen atoms also present in the processing chamber, to produce a gas phase deposition mixture of an at least partially ionized inert gas, titanium atoms, nitrogen atoms, ionized titanium, ionized nitrogen, and titanium nitride atoms. This gas phase mixture is contacted with the surface of a semiconductor substrate on which a titanium nitride barrier layer is to be deposited. The semiconductor substrate resides upon a platen which is heated so that the surface of the substrate can be controlled within a desired range. Further, the pressure in the process chamber can be adjusted by continuous evacuation of gaseous components from the process chamber. By controlling the gas phase deposition mixture composition, the quantity of the deposition mixture contacting the substrate surface over a given time period, and the pressure within the process chamber, the resistivity and surface roughness of the titanium nitride layer is adjusted.

We have discovered the physical characteristics of the titanium nitride layer which provide reduced resistivity and a smoother film surface. Further, we have determined the process conditions necessary to create a titanium nitride layer having lower resistivity and a smoother film surface.

The resistivity of the titanium nitride barrier layer is principally determined by the crystal orientation of the titanium nitride. The more nearly the crystal orientation approaches 100% (per cent) of the {200} orientation (the lower the percentage of 111 orientation), the lower the film resistivity. Preferably the percent of {200} orientation is at least 70 percent. The {200} crystal orientation is obtained by increasing the ionized content of the deposition mixture (by increasing the RF power to the ionization coil) and by slowing the rate of deposition of the titanium nitride film (by decreasing the DC power to the target).

The surface roughness of the titanium nitride layer is reduced principally by reducing the pressure in the process chamber, which appears to affect the film formation dynamics, all other factors being constant. An increase in ionized content of the gas phase deposition mixture helps reduce surface roughness until an inflection point is reached, after which surface roughness increases with increased ionized content.

DETAILED DESCRIPTION OF THE PREFERRED EMBODIMENTS

Figure 1A:
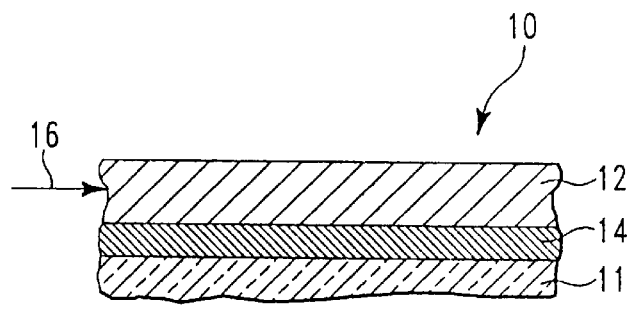
FIG. 1A shows a cross-sectional schematic of an interconnect stack, comprising: a dielectric substrate such as silicon dioxide; an overlying diffusion barrier layer, preferably titanium nitride; and, having a conductive layer, preferably aluminum, overlying the diffusion barrier layer.
Figure 1B:
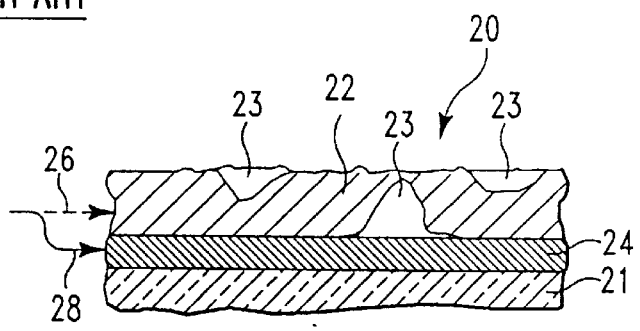
FIG. 1B shows a cross-sectional schematic of the interconnect stack of FIG. 1A after stress and/or electromigration has impaired the conductivity of an aluminum conductive layer so that the titanium nitride diffusion barrier layer becomes a functional conductive layer of the interconnect stack.

The present disclosure pertains to a titanium nitride structure which provides improved conductivity and a smoother surface in a film or layer of titanium nitride. The disclosure also provides a method by which the improved titanium nitride structure is obtained.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, reference to "the contact material" includes aluminum, aluminum alloys, and other conductive materials which have a melting point enabling them to be sputtered over the temperature range described herein.

Specific terminology of particular importance to the description of the present invention is defined below.

The term "AFM" (Atomic Force Microscope) refers to a technique commonly used to measure film surface roughness, wherein a microprobe in contact with the film surface is drawn across the film and the mechanical movement of the microprobe is translated to a digital signal which is plotted out. A series of plots is compiled and a surface roughness is calculated from the compilation.

The term "aluminum" includes alloys of aluminum of the kind typically used in the semiconductor industry. Such alloys include aluminum-copper alloys, and aluminum-copper-silicon alloys, for example.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "feature" refers to contacts, vias, trenches, and other structures which make up the topography of the substrate surface.

The term "film resistivity" refers to a resistivity calculated from sheet resistance and film thickness measurements and is equal to the sheet resistance (measured by the 4 probe method) times the film thickness.

The term "ion-deposition sputtered" and the term "ion metal plasma" (IMP) refer to a particular technique for sputter deposition, preferably magnetron sputter deposition (where a magnet array is placed behind the target). In particular, a high density, inductively coupled RF plasma is positioned between the sputtering cathode and the substrate support electrode, whereby at least a portion of the sputtered emission is in the form of ions at the time it reaches the substrate surface.

The term "reactive ion deposition" or "reactive ion metal plasma (IMP)" refers to ion-deposition sputtering wherein a reactive gas is supplied during the sputtering to react with the ionized material being sputtered, producing an ion-deposition sputtered compound containing the reactive gas element.

The term "traditional sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

The term "XRD" (X-ray Diffraction) refers to a technique commonly used to measure crystalline orientation, wherein radiation over particular wavelengths is passed through the material to be characterized, and the diffraction of the radiation, caused by the material through which it passes, is measured. A map is created which shows the diffraction pattern, and the crystal orientation is calculated based on this map.

II. An Apparatus for Practicing the Invention

Figure 2:
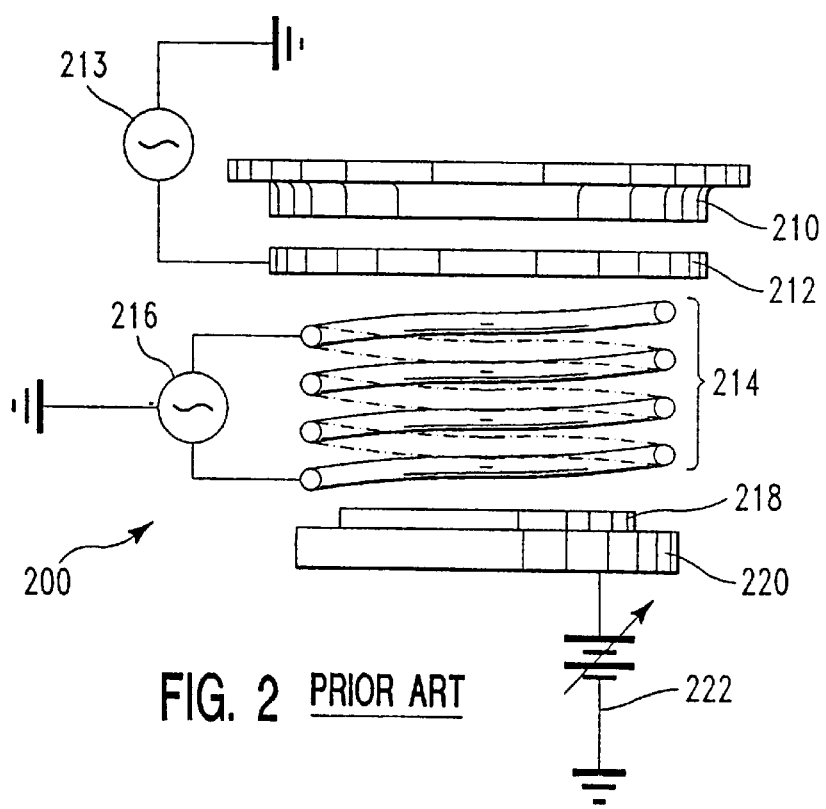
FIG. 2 shows a schematic of the elements of a process chamber which enable physical vapor deposition augmented by an ion metal plasma.

A process system in which the method of the present invention may be carried out is the Applied Materials, Inc. (Santa Clara, Calif.) Endura® Integrated Processing System. This process system is not specifically shown in the Figures, however, the processing elements shown in FIG. 2 can be operated within one of the low pressure process chambers contained within such an Integrated Processing System. The system is shown and described in U.S. Pat. Nos. 5,186,718 and 5,236,868, the disclosures of which are incorporated by reference. With reference to FIG. 2, one low pressure process chamber for forming the smooth-surfaced, low resistivity, titanium nitride barrier layer of the present invention employs a standard sputter magnet 210 (to increase ion formation adjacent the target, thereby enabling an increased sputtering rate) and a sputtering target cathode 212 which operates at power levels up to about 24 kW.

EXAMPLE ONE

To form the titanium nitride barrier layer of the present invention, a titanium target cathode of 14 inches (35.5 cm) in diameter was used, and a DC power was applied to this cathode over a range from about 4 kw to about 8 kW. The substrate 218, comprising an 8 inch (20.3 cm) diameter silicon wafer, was placed a distance of about 5.5 inches (14 cm) from target cathode 212. A high density, inductively coupled RF plasma was generated in the region between the target cathode 212 and the substrate 218 by applying RF power 216 over a range from about 100 kHz to about 60 MHz (preferably about 2 MHz), at a wattage ranging from about 0.5 kW to about 6 kW (preferably ranging from about 1.5 kW to about 4.0 kW), to a coil 214 having at least one turn up to about 10 turns (preferably from about 1 to 3 turns). Typically the coil is fabricated from metal tubing which permits water cooling, and has a diameter of about 0.125 inch (0.32 cm). However, the coil can be fabricated from a sheet or ribbon, or other form which provides the desired function. Coil 214 surrounded a plasma region between the target 212 and substrate 218. Optionally, a substrate bias voltage ranging from 0 to about −300 V DC is applied to the substrate 218 or the support member 220 to create a DC bias which attracts ions from the plasma to the substrate.

Although the preferred apparatus for forming the titanium nitride barrier layer uses a coil to inductively couple with the plasma and ionize the sputtered material, other means for ionizing the titanium are contemplated. For example, an ECR source, such as that shown and described in U.S. Pat. No. 4,911,814, incorporated herein by reference, or a helicon type coupling device such as that shown in U.S. Pat. No. 4,990,229, incorporated herein by reference, are also specifically contemplated. Likewise other apparatus which would supply an ionized stream of deposition particles having an ionized percentage of 10 to 100% are contemplated as being useful to practice the invention. Although the preferred apparatus for forming the titanium atoms which are ionized and reacted with ionized nitrogen to form titanium nitride are preferably formed using sputtering techniques, other means for producing titanium atoms are contemplated. For example titanium evaporation techniques, such as the technique described in U.S. Pat. No. 4,944,961 for vaporizing metal or metal alloy in a crucible, incorporated herein by reference, are also specifically contemplated.

III. THE STRUCTURE OF LOW RESISTIVITY TITANIUM NITRIDE FILM

As previously described, we have discovered that it is possible to produce a titanium nitride film having an unexpectedly low resistivity using reactive ion-deposition sputtering techniques. A low resistivity film provides better device performance.

The film resistivity of the titanium nitride layer is measured by a combination of sheet resistance and film thickness; film orientation is measured by XRD (X-ray diffraction).

Figure 3A:
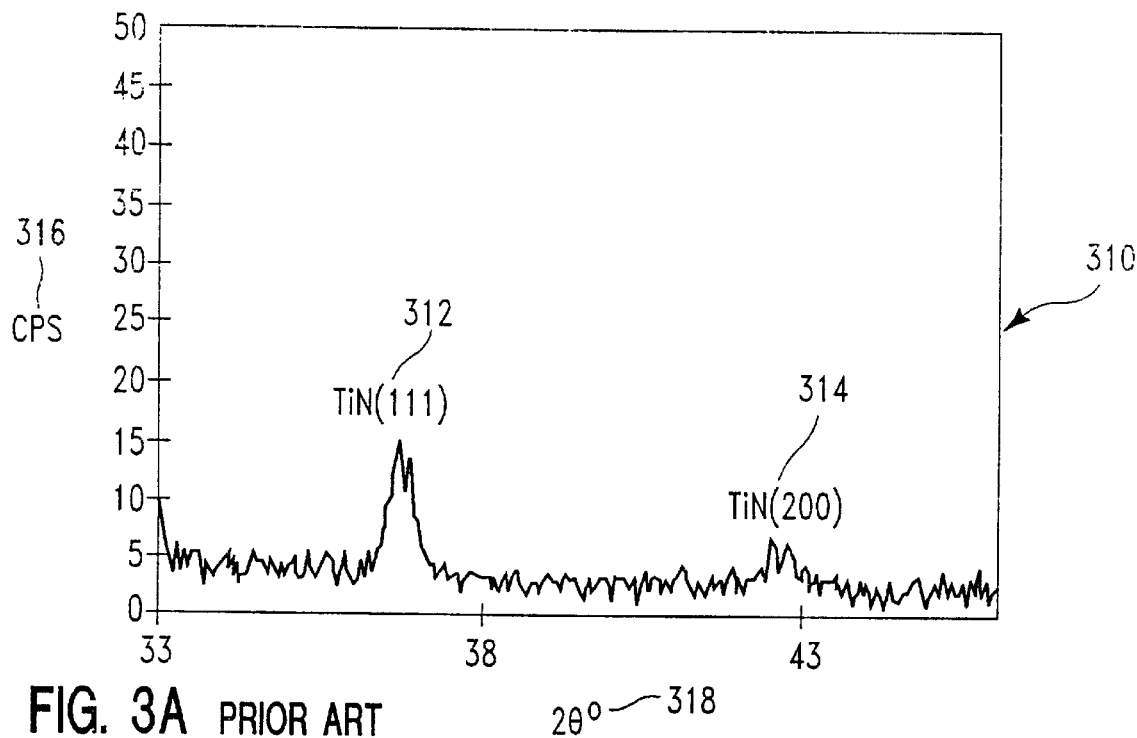
FIG. 3A shows an X-ray diffraction curve for a titanium nitride film having a resistivity of about 203 μΩ-cm and a surface roughness of about 15 Å.

FIG. 3A shows an X-ray diffraction scan pattern 310 for a reactive ion-deposition titanium nitride film produced prior to the present invention. The portion of the film composition having a {111} crystal orientation is labeled "312", and the portion of the film composition having a {200} crystal orientation is labeled "314". The scanning was done using the standard θ–2θ technique, with two times the angle of incidence shown on the "x" axis which is labeled "318". The intensity of the diffraction in counts per second (CPS) is shown on the "y" axis which is labeled "316". The X-ray diffraction scan indicates that the larger portion of the titanium nitride film composition comprises a 111 crystal orientation. The film resistivity for this titanium nitride film is 203 $\mu\Omega$-cm.

Figure 3B:
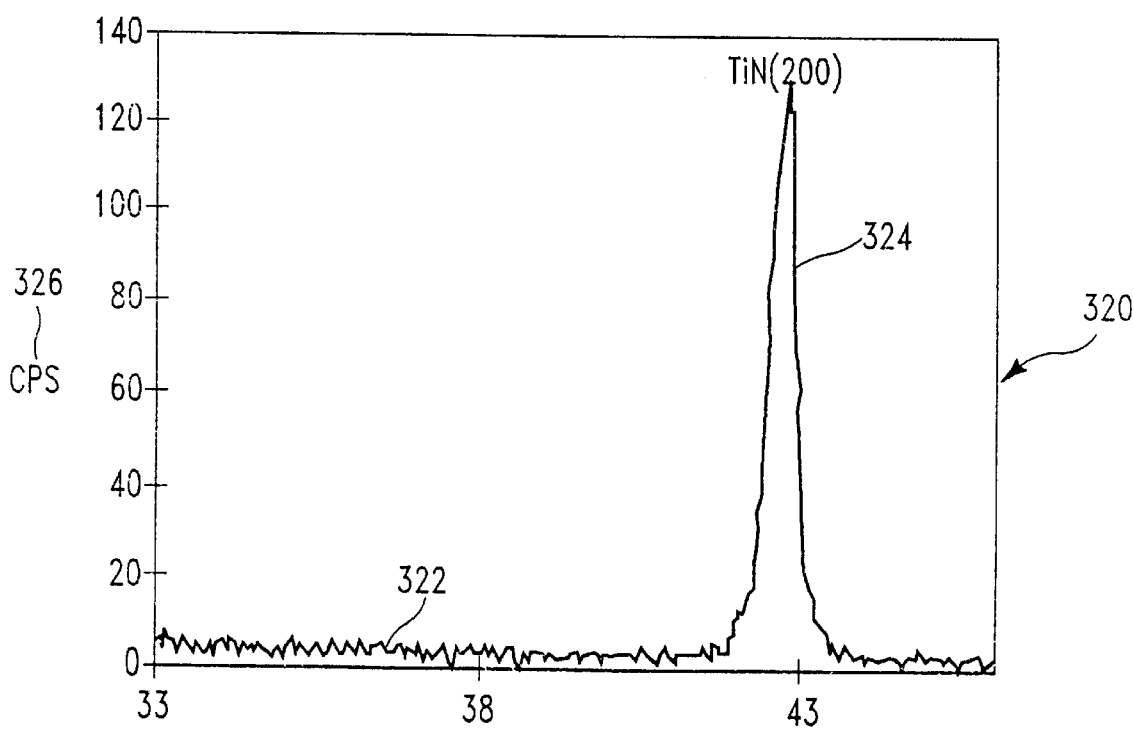
FIG. 3B shows an X-ray diffraction curve for a titanium nitride film produced using the method of the present invention and having a resistivity of about 52 μΩ-cm and a surface roughness of about 5 Å.

By comparison, FIG. 3B shows an X-ray diffraction scan pattern 320 for a titanium nitride film of the present invention. The scan pattern shows no measurable presence of {111} crystal orientation, the location on the scan indicating this absence is labeled "322". The presence of the film composition having a {200} crystal orientation is labeled "324". Again, two times the scanning angle of incidence is shown on the "x" axis, labeled as "328", and the intensity of the diffraction is shown on the "y" axis and is labeled "326". The film resistivity, calculated as described above is 521 $\mu\Omega$-cm. This low resistivity is unexpected in the light of data published in the art.

Figure 4A:
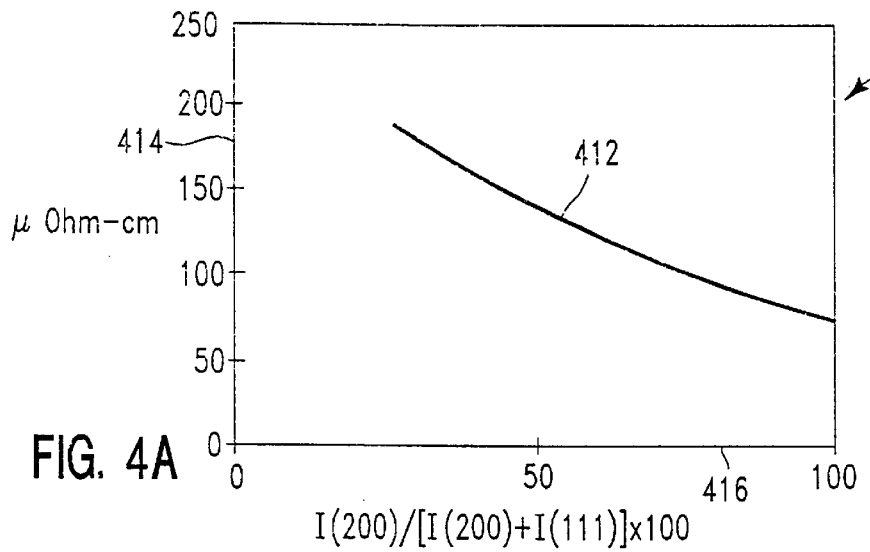
FIG. 4A illustrates the reduction in resistivity of a titanium nitride film as a function of the percentage of the crystal orientation which is {200}.

FIG. 4A presents a graph 410 which illustrates the decrease in resistivity which is obtained as the percentage of {200} crystal orientation in the titanium nitride film is increased. The percent of {200} crystal orientation is shown on the "x" axis which is labeled "416", and the resistivity is shown on the "y" axis which is labeled "414". The curve 412 representing the relationship between percentage of {200} crystal orientation and resistivity was produced using more than 15 measurements for individual titanium nitride films produced under varying process conditions which will be discussed in detail below. FIG. 4A clearly illustrates that as the amount of {200} crystal orientation is increased, resistivity of the titanium nitride film decreases toward a minimum of about 50 $\mu\Omega$-cm.

Figure 4B:
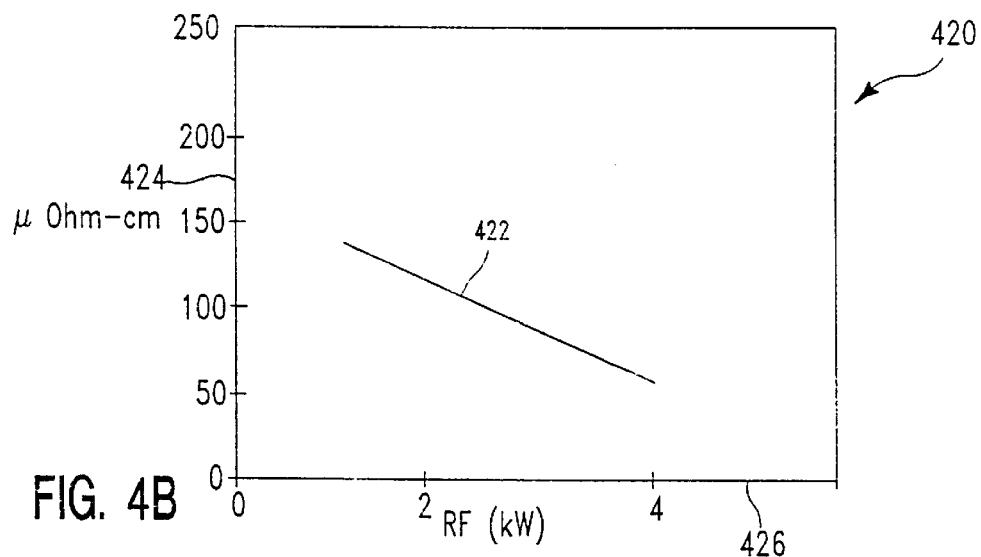
FIG. 4B shows the reduction in resistivity of a titanium nitride film as the RF power to the ionization coil is increased (increasing the ionized content of the gas phase mixture from which the titanium nitride film is deposited).

FIG. 4B presents a graph 420 which shows the resistivity as a function of the RF power to the ionization coil of the IMP process apparatus. In particular, the RF power is shown in the "x" axis which is labeled "426", and the resistivity is shown on the "y" axis which is labeled "424". The curve 422 representing the relationship between RF power to the ionization coil and resistivity was produced using more than 11 measurements for individual titanium nitride films produced under process conditions which will be discussed in detail below. FIG. 4B clearly illustrates that as the RF power to the ionization coil is increased, increasing the ionization content of the gas plasma from which the titanium nitride film is deposited, the resistivity of the deposited titanium nitride film decreases.

Figure 4C:
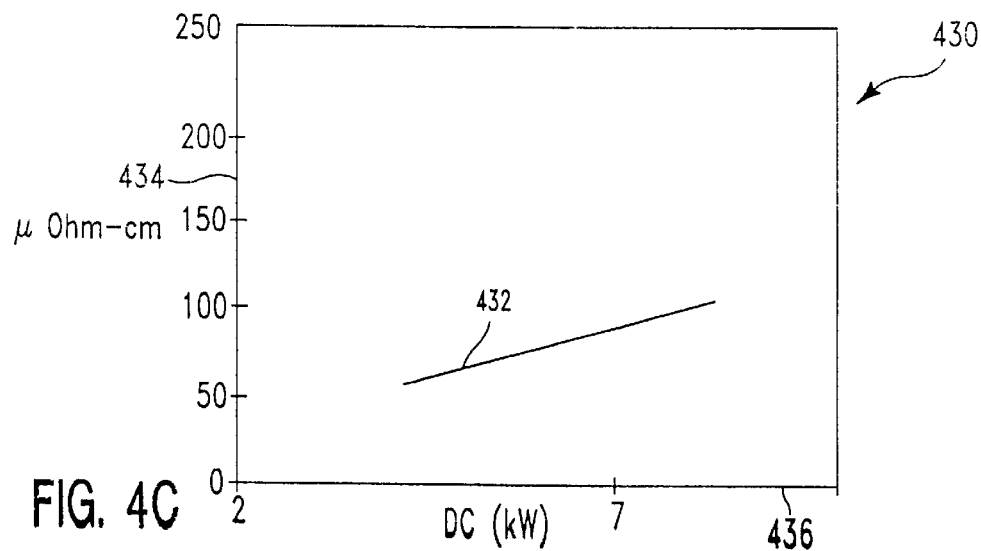
FIG. 4C shows the reduction in resistivity of a titanium nitride film as the DC power to the target is decreased (decreasing the quantity of titanium atoms available for processing in the gas phase and ultimately the rate of deposition of the titanium nitride film).

FIG. 4C presents a graph 430 which shows the resistivity as a function of the DC power to the titanium target of the IMP process apparatus. In particular, the DC power is shown in the "x" axis which is labeled "436", and the resistivity is shown on the "y" axis which is labeled "434". The curve 432 representing the relationship between DC power to the titanium target and resistivity was produced using more than 12 measurements for individual titanium nitride films produced under process conditions which will be discussed in detail below. FIG. 4C clearly illustrates that as the DC power to the titanium target is decreased, decreasing the quantity of titanium atoms available for processing in the gas phase and ultimately the rate of deposition of the titanium nitride film, the resistivity of the deposited titanium nitride film decreases.

IV. The Method of Producing Low Resistivity Titanium Nitride Film

The process conditions necessary to generate the higher percentage of {200} crystal structure which correlates with the unexpectedly low resistivity described above are described below.

Traditionally sputtered titanium nitride, as previously defined, does not make use of ionization of the sputtered metal prior to its deposition on a substrate. Titanium nitride films produced using traditional sputtering techniques typically exhibit a percentage of {200} crystal orientation below about 10% and exhibit a resistivity of greater than 150 $\mu\Omega$-cm. A typical traditional sputtering process, such as magnetron sputter deposition, would provide for the use of a sputtering target (cathode) consisting essentially of titanium. A plasma created from a combination of an inert gas, such as argon, and nitrogen is contacted with the target to simultaneously generate titanium atoms, titanium ions, and titanium nitride atoms. From the mixture which includes titanium and titanium nitride atoms, a film is deposited on a substrate which typically resides on a support platen which is spaced about 2 inches (5 cm) from the sputtering target. The nitrogen content of the plasma gas feed is controlled to produce a metal film containing the desired nitrogen to titanium content ratio. A typical plasma gas feed would be 10 sccm of argon and 60 sccm of nitrogen, with pressure in the process vessel maintained at about 4 mT. This gas feed in combination with the 6.5 kW DC to the target, and a process pressure of about 4 mT in the process apparatus described above, would typically produce a film having a stoichiometric nitrogen to titanium content ratio of 50% nitrogen to 50% titanium. The substrate temperature is typically about 200° C., with heat applied through the support platen (heater) which is generally set at slightly greater than 200° C.

Titanium nitride sputtered using IMP, as defined above, uses a high density, inductively coupled RF plasma positioned between the sputtering cathode and the support platen (electrode), where at least a portion of the atoms and ions created during the sputtering process are maintained in or placed in an ionized form until the time they reach the substrate. Titanium nitride films produced using IMP, prior to the present invention, typically exhibited a percentage of {200} crystal orientation below about 30%, and such films exhibit a resistivity of greater than about 150 $\mu\Omega$-cm.

With reference to FIG. 2, to produce the titanium nitride films of the present invention, the sputtering target cathode 212 consists essentially of titanium. Typically, approximately 8 kW of D.C. power is applied to target cathode 212. A plasma is created from a mixture of argon and nitrogen gases, with the argon gas flowing at approximately 10 sccm and the nitrogen gas flowing at about 60 sccm, with pressure in the process vessel maintained at about 32 mT. The argon/nitrogen plasma is contacted with the sputtering target cathode 212 to simultaneously generate titanium atoms and ions and titanium nitride atoms and ions. This mixture is passed through coil 214 which maintains at least a portion of this mixture in the form of ions at the time the metals are deposited on substrate 218 which is spaced approximately 5.5 inches (14 cm) beneath sputtering target cathode 212. Typically about 1.5 kW of RF power at about 2 MHz is applied through coil 214. From the mixture which includes titanium and titanium nitride atoms, metals are deposited on a substrate 218 which resides on a support platen (electrode) 220. Optionally, a substrate bias voltage ranging from greater than 0 to about −300 V of D.C. is applied to support platen 220 to attract ions from the plasma to the substrate. The temperature of the substrate is typically about 300° C. under these conditions, with the support platen (heater) set at about 200° C. This gas feed in combination with the 8 kW DC to the target cathode 212 and the 1.5 kW RF to coil 214, at a pressure of about 32 mT, typically produce a film having a stoichiometric titanium nitride content (50% titanium and 50% nitrogen).

It has been discovered that by decreasing the DC power to sputtering target cathode 212, and increasing the RF power to coil 214, it is possible to obtain an unexpected decrease in the resistivity of the titanium nitride film produced (all other variables held constant at the values described above). Although it is possible to obtain a decrease in resistivity by increasing the temperature of the substrate, this temperature would have to be increased to more than 400° C. to obtain any substantial decrease in resistivity, and this temperature increase is harmful to other performance properties of the titanium nitride film.

For example, a significant reduction in resistivity (to about 90 or less) can be obtained by setting the DC power to sputtering target cathode 212 within a range between about 1.5 and 7 kW; setting the RF power within a range between about 2 kW and 5 kW; and setting the process pressure within a range between about 5 mT and 30 mT (Substrate temperature maintained at about 300° C.).

EXAMPLE TWO

Using the equipment described above, with the DC power to sputtering target cathode 212 set at 6 kW; the coil 214 RF power set at 2 MHz and 4 kW; an argon gas flow rate of 10 sccm and a nitrogen gas flow rate of 60 sccm; with the process chamber pressure set at 25 mT; and, the substrate surface at about 300° C., a 600 Å thick titanium nitride film having a stoichiometric titanium nitride content, a {200} crystal orientation of about 100% and a resistivity of about 52 $\mu\Omega$-cm was obtained.

The lower resistivity is attributed to the high {200} crystal orientation of the titanium nitride-comprising film. These physical characteristics are attributed to control of the gas phase deposition mixture composition and the quantity of the deposition mixture contacting the substrate surface over a given time period. The gas phase deposition mixture composition is believed to depend to a large extent on the DC power to the target and the RF power to the ionization coil. The quantity of the deposition mixture contacting the substrate surface over a given period of time is believed to depend to a large extent on these two factors as well, all other factors such as plasma composition and substrate temperature being held constant.

V. The Method of Producing a Smooth Titanium Nitride Film

As previously described, we have discovered that it is possible to produce a titanium nitride film having a significantly smoother surface than that previously known in the art.

Film roughness as referenced herein was measured by AFM (atomic force microscope).

By controlling the gas phase deposition mixture composition and the quantity of the deposition mixture contacting the substrate surface over a given time period, the surface roughness of a reactive ion deposition sputtered titanium nitride film can be adjusted. Although the variables adjusted to produce a low resistivity titanium nitride film also affect the smoothness of the titanium nitride film surface, the variable which has the most pronounced effect of film surface smoothness, the process vessel pressure, does not appear to be the most critical variable in determining resistivity. In any case, there is an overlapping area where the process variables are adjusted to provide both low resistivity and a smooth titanium nitride surface.

Figure 5A:
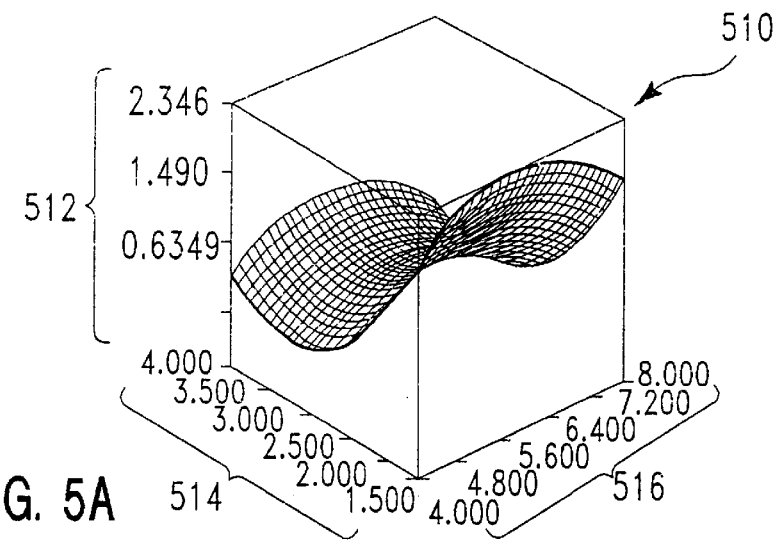
FIG. 5A shows a three dimensional plot of the surface roughness of a titanium nitride film as a function of DC power to the titanium target and RF power to the ionization coil, with the pressure in the process chamber held constant.
Figure 5B:
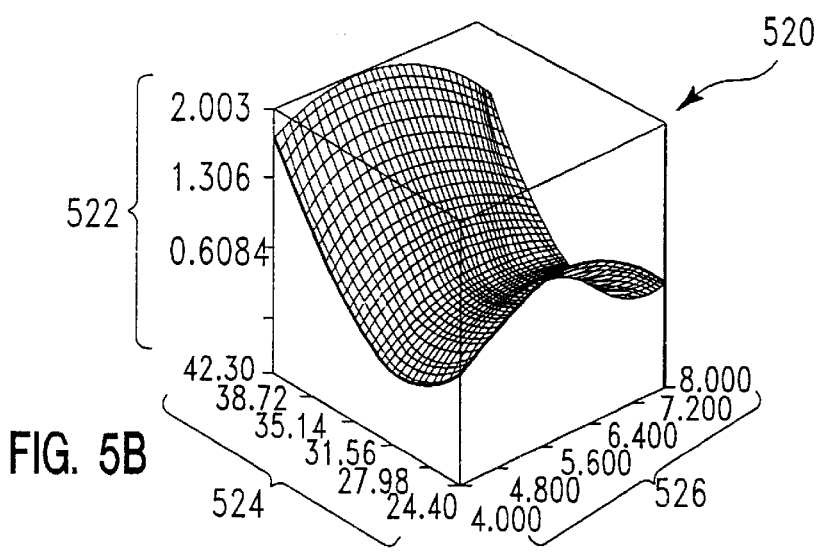
FIG. 5B shows a three dimensional plot of the surface roughness of a titanium nitride film as a function of DC power to the titanium target and pressure in the process chamber with the RF power to the ionization coil held constant.
Figure 5C:
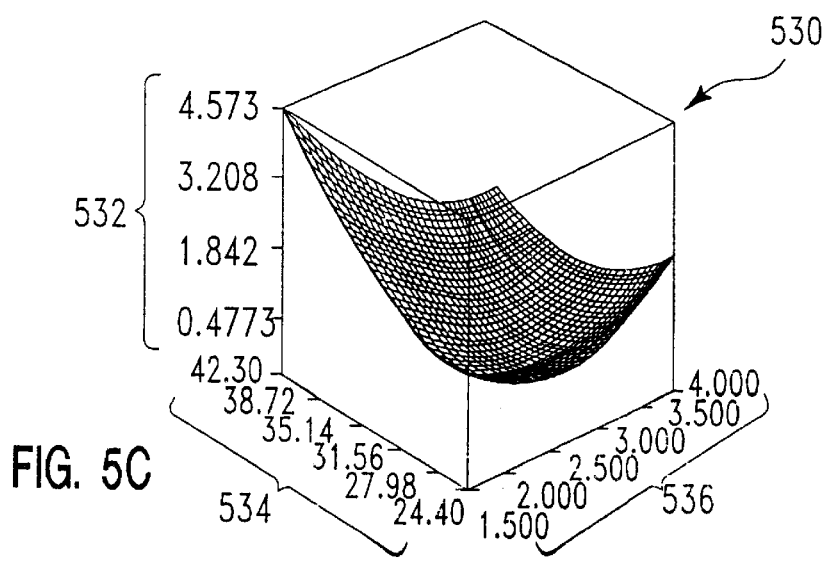
FIG. 5C shows a three dimensional plot of the surface roughness of a titanium nitride film as a function of the RF power to the ionization coil and pressure in the process chamber with the DC power to the titanium target held constant.

With regard to the smooth surface, FIGS. 5A, 5B, and 5C illustrate the effect of changes in DC power to the sputtering target, RF power to the ionization coil, and process vessel pressure on the surface roughness of the titanium nitride film (all other variables held constant).

FIG. 5A shows a three dimensional diagram 510 depicting the change in titanium nitride film surface roughness in nanometers on the "y" axis, labeled "512", as a function of the RF power in kW @ 2 MHz) on the "x" axis, labeled "514", and as a function of the DC power to the target in kW on the "z" axis, labeled "516". The process vessel pressure was about 33.3 mT; the substrate surface temperature was 300° C.; the process gases were argon flowing at a rate of 10 sccm and nitrogen flowing at a rate of 60 sccm; and the film thickness was approximately 600 Å.

As illustrated in FIG. 5A, surface roughness of the film can be optimized to a lower value over a particular range of RF power to the ionization coil, between about 2 and about 3.5. The DC power to the target also has an effect, but not as pronounced. Over the range measured, and within the RF power range which provided the greatest improvement (the best reduction in film surface roughness) the preferred DC power is either the low end (about 4.0 kW) or at the high end (about 8 kW) of the range examined.

FIG. 5B shows a three dimensional diagram 520 depicting the change in titanium nitride film surface roughness in nanometers on the "y" axis, labeled "522", as a function of the process vessel pressure in mT on the "x" axis, labeled "524", and as a function of the DC power to the target in kW on the "z" axis, labeled "526". The RF power to the coil was about 2.75 kW; with the other process variables being the same as specified for the data illustrated in FIG. 5A.

As illustrated in FIG. 5B, surface roughness of the film can be optimized to a lower value by reducing the pressure in the process vessel when such pressure is higher than about 28 mT. Once again, the DC power has an effect, but not nearly as pronounced, with the preferred DC power being either near the low end or at the high end of the range examined.

FIG. 5C shows a three dimensional diagram 530 depicting the change in titanium nitride film surface roughness in nanometers on the "y" axis, labeled "532", as a function of the process vessel pressure in mT on the "x" axis, labeled "534", and as a function of the RF power to the target in kW on the "z" axis, labeled "536". The DC power to the target was 6 kW; with the other process variables being the same as specified for the data illustrated in FIG. 5A.

As illustrated in FIG. 5C, surface roughness of the film can be optimized to a lower value by reducing the pressure in the process vessel, at least for pressures higher than about 28 mT. The RF power to the coil has a less pronounced effect, with the reduction in surface roughness being greater when the RF power ranges between about 2 and about 3.

EXAMPLE THREE

Using the equipment described above, with the DC power to sputtering target cathode 212 set at 6 kW; the coil 214 RF power set at 2 MHz and 4 kW; an argon gas flow rate of 10 sccm and a nitrogen gas flow rate of 60 sccm; with the process chamber pressure set at 25 mT; and, the substrate surface at about 300° C., a 600 Å thick titanium nitride film having a stoichiometric titanium and nitrogen content, a {200} crystal orientation of about 100%, a resistivity of about 52 $\mu\Omega$-cm, and a surface roughness of 0.57 nanometers (5.7 Å) was obtained. Prior to the present invention, a typical surface roughness for reactive ion deposition sputtered titanium nitride films had been in the range of about 11 Å. A titanium nitride film having a smoother film surface reduces any topography on the film surface which might be carried through on overlying layers, thereby improving photolithographic indexing during subsequent process steps.

To obtain a titanium nitride film having both a lower resistivity and a smoother surface, it is important to both increase the RF power to the ionization coil and to lower the pressure in the process chamber. Of course there are limits to the increase in RF power, as the mechanical integrity of the coil will degrade, In addition, there are limits to the minimum pressure which can be used, as a process vessel pressure below about 0.5 mT makes ionization impractical. In cases where the titanium nitride is used as a barrier layer within an electrical contact via, a decrease in pressure below about 5–10 mT may reduce the amount of ionization to the point that inadequate bottom coverage of the via results. An increase in ionization content of the deposition mixture also helps provide a lower resistivity, but will assist in the reduction of surface roughness only until an inflection point is reached, after which surface roughness increases with increased ionization content.

The above-described preferred embodiments are not intended to limit the scope of the present invention, as one skilled in the art can, in view of the present disclosure expand such embodiments to correspond with the subject matter of the invention claimed below. For example, when the methods described herein are carried out in an apparatus other than that specifically described herein, the range of the process variables which provides the optimum results may vary somewhat although the concepts disclosed herein will enable one skilled in the art to practice the invention with minimal experimentation.

We claim:

1. A method of producing a titanium nitride film having a resistivity of less than 70 $\mu\Omega$-cm by an ion-deposition sputtering process, said method comprising: adjusting the percentage of ionization of a gas phase deposition mixture to fall within a predetermined range and adjusting a deposition rate of said film on a substrate to fall within a predetermined range, so that at least 70% of <200> crystal orientation is obtained in said film.

2. The method of claim 1, wherein said titanium nitride film crystal orientation is obtained by adjusting RF power applied to an ionization source.

3. The method of claim 2, wherein said crystal orientation is further obtained by adjusting RF power applied to an ionization source.

4. A method of producing a titanium nitride film having a surface roughness of less than about 11 Å, wherein said method comprises an ion-deposition sputtering process which includes the steps of:
   a) adjusting a process vessel pressure and a power applied to a titanium or titanium nitride target, whereby a predetermined rate of deposition of a titanium nitride film upon a substrate is obtained; and
   b) adjusting a percentage of ionization of a deposition mixture from which said film is deposited to fall within a predetermined range, so that a combination of said film deposition rate and said percentage of ionization of said deposition mixture produces a film having a surface roughness of about 11 Å or less.

5. The method of claim 4, wherein said deposition rate of a titanium nitride film is adjusted to be within said predetermined rate by adjusting said pressure in said process vessel to be less than about 40 mT.

6. The method of claim 5, wherein said percentage of ionization in said deposition mixture is adjusted by adjusting RF power to an ionization source.

7. A method of producing a titanium nitride film having a resistivity of less than about 75 $\mu\Omega$-cm and a surface roughness of less than about 11 Å, said method including an ion-deposition sputtering process and comprising the steps of adjusting a rate of deposition of said titanium nitride film upon a substrate to fall within a predetermined range and adjusting a percentage of ionization of a deposition mixture from which said titanium nitride film is deposited to fall within a predetermined range, so that a combination of said film deposition rate and said percentage of ionization of said deposition mixture produces a film having a surface roughness of about 11 Å or less and a resistivity of less than about 75 $\mu\Omega$-cm.

8. The method of claim 7, wherein said rate of deposition is adjusted by adjusting a pressure in a process vessel in which said ion-deposition sputtering process is carried out.

9. The method of claim 8, wherein said percent of ionization of said deposition mixture is adjusted by adjusting RF power applied to an ionization source.

10. The method of claim 9, wherein said ionization source is an ionization coil.

\* \* \* \* \*